United States Patent
Hayashi et al.

(10) Patent No.: US 8,941,037 B2
(45) Date of Patent: Jan. 27, 2015

(54) SUBSTRATE PROCESSING APPARATUS, FOCUS RING HEATING METHOD, AND SUBSTRATE PROCESSING METHOD

(75) Inventors: Daisuke Hayashi, Nirasaki (JP); Kazuya Nagaseki, Nirasaki (JP)

(73) Assignee: Tokyo Electron Limited, Tokyo (JP)

(*) Notice: Subject to any disclaimer, the term of this patent is extended or adjusted under 35 U.S.C. 154(b) by 1906 days.

(21) Appl. No.: 11/950,773

(22) Filed: Dec. 5, 2007

(65) Prior Publication Data

US 2008/0149598 A1    Jun. 26, 2008

Related U.S. Application Data

(60) Provisional application No. 60/908,713, filed on Mar. 29, 2007.

(30) Foreign Application Priority Data

Dec. 25, 2006    (JP) .................................. 2006-348379

(51) Int. Cl.
*H05B 6/10* (2006.01)
*H05B 6/36* (2006.01)
(Continued)

(52) U.S. Cl.
CPC ..... *H01L 21/68735* (2013.01); *H01J 37/32522* (2013.01); *H01J 37/32642* (2013.01);
(Continued)

(58) Field of Classification Search
CPC .............. H01J 37/32082; H01J 37/32522; H01J 37/32642; H01J 37/32706; H01L 21/67109; H01L 21/6831; H01L 21/68735; H01L 21/67103; H05B 6/105

USPC ................. 219/675, 121.36, 121.4, 121.41, 219/121.43, 638, 634; 156/345.52, 345.24, 156/345.48, 345.54, 345.37, 345.27, 345.15

See application file for complete search history.

(56) References Cited

U.S. PATENT DOCUMENTS 5,529,657 A * 6/1996 Ishii .......................... 156/345.26
6,218,312 B1 * 4/2001 Collins et al. ............ 156/345.27
(Continued)

FOREIGN PATENT DOCUMENTS

| JP | 10-64882 A | 3/1998 |
|---|---|---|
| JP | 2005121616 A * | 5/2005 |
| JP | 2005-353812 | 12/2005 |
| WO | WO 2004003968 A2 * | 1/2004 |

OTHER PUBLICATIONS

Japanese Office Action issued on Feb. 9, 2011 in corresponding Japanese Application No. 2006-348379 (with an English Translation).

*Primary Examiner* — Henry Yuen
*Assistant Examiner* — Hung D Nguyen
(74) *Attorney, Agent, or Firm* — Oblon, Spivak, McClelland, Maier & Neustadt, L.L.P.

(57) ABSTRACT

A substrate processing apparatus that can accurately control the temperature of a focus ring without causing abnormal electric discharge and the back-flow of radio frequency electrical power during the application of radio frequency electrical power. A wafer is mounted on a mounting stage disposed in a housing chamber. An annular focus ring is mounted on the mounting stage in such a manner as to surround the peripheral portion of the mounted wafer. The pressure in the housing chamber is reduced, radio frequency electrical power is applied to the mounting stage, and the focus ring generates heat by itself.

5 Claims, 6 Drawing Sheets

(51) Int. Cl.
*H01L 21/687* (2006.01)
*H01J 37/32* (2006.01)
*H01L 21/67* (2006.01)
*H01L 21/683* (2006.01)

(52) U.S. Cl.
CPC ..... *H01J37/32706* (2013.01); *H01L 21/67103* (2013.01); *H01L 21/67109* (2013.01); *H01L 21/6831* (2013.01); *H05B 6/105* (2013.01)
USPC ............................ 219/638; 219/634; 219/675

(56) References Cited

U.S. PATENT DOCUMENTS

| | | | |
|---|---|---|---|
| 6,780,278 B2* | 8/2004 | Hayashi et al. | 156/345.47 |
| 2004/0182311 A1* | 9/2004 | Hanazaki | 118/663 |
| 2004/0261946 A1* | 12/2004 | Endoh et al. | 156/345.15 |
| 2005/0103275 A1* | 5/2005 | Sasaki et al. | 118/728 |
| 2005/0103444 A1* | 5/2005 | Brcka | 156/345.48 |
| 2006/0196605 A1* | 9/2006 | Ikegami et al. | 156/345.51 |

* cited by examiner

SUBSTRATE PROCESSING APPARATUS, FOCUS RING HEATING METHOD, AND SUBSTRATE PROCESSING METHOD

BACKGROUND OF THE INVENTION

1. Field of the Invention

The present invention relates to a substrate processing apparatus, a focus ring heating method, and a substrate processing method, and in particular to a substrate processing apparatus, a focus ring heating method, and a substrate processing method that control the temperature of a focus ring.

2. Description of the Related Art

In subjecting a wafer as a substrate to plasma processing such as etching, the temperature of the wafer affects the width and depth of grooves formed in a surface of the wafer through etching, and hence it is required to maintain the entire surface of the wafer at a constant temperature during etching.

Substrate processing apparatuses that subject wafers to etching are comprised of a chamber that houses wafers, and a mounting stage on which is mounted a wafer during etching (hereinafter referred to as "the susceptor"). In the chamber, plasma is produced to etch each wafer, and the susceptor has a temperature adjusting mechanism to control the temperature of each wafer. When a wafer is subjected to etching, the wafer is increased in temperature due to exposure to heat from the plasma, and hence the temperature adjusting mechanism of the susceptor cools the wafer so that the wafer is maintained at a constant temperature.

Moreover, in the susceptor, an annular focus ring made of silicon or the like is mounted on the susceptor in such a manner as to surround a peripheral portion of the wafer. The focus ring focuses plasma in the chamber toward the wafer, and the focus ring itself is increased in temperature to, for example, 300 to 400° C. due to exposure to heat from the plasma during etching.

During etching, the most part of the wafer is cooled by the temperature adjusting mechanism of the susceptor, but the peripheral portion of the wafer is affected by radiant heat from the focus ring, and hence it is difficult to maintain the entire surface of the wafer at a uniform temperature. Therefore, it is necessary to control the temperature of the focus ring. It is known that a heater is provided in the focus ring so as to control the temperature of the focus ring (see e.g. Japanese Laid-Open Patent Publication (Kokai) No. 2005-353812).

Moreover, when a plurality of wafers are subjected to etching one by one by the substrate processing apparatus, changes in focus ring temperature with time have to be made uniform in etching of all the wafers so as to obtain the same etching results with respect to all the wafers.

Meanwhile, since the interior of the chamber is evacuated, a vacuum heat insulation layer is formed at a boundary between the focus ring and the susceptor. Thus, heat cannot be transferred from the focus ring to the susceptor only by mounting the focus ring on the susceptor. For this reason, although the temperature of the focus ring increases to, for example, 300 to 400° C. in etching of each wafer, the initial temperature of the focus ring in etching of the first wafer is low since it had not been exposed to heat before etching, and hence the temperature of the focus ring does not increase to 300° C. Namely, since the initial temperature of the focus ring in etching of the first wafer and the initial temperature of the focus ring in etching of the second and subsequent wafers are different, changes in focus ring temperature with time in etching of the first wafer and changes in focus ring temperature with time in etching of the second and subsequent wafers are different (see FIG. 7A). As a result, the result of etching on the first wafer and the result of etching on the second and subsequent wafers are different.

To cope with this, there has been developed a method in which the heat transfer efficiency between the focus ring and the susceptor is improved, and the focus ring is actively cooled by the temperature adjusting mechanism of the susceptor, so that changes in focus ring temperature with time are made substantially uniform in etching of all the wafers (see FIG. 7B). In this method, to improve the heat transfer efficiency between the focus ring and the susceptor, a heat transfer sheet is interposed between the focus ring and the susceptor, or the focus ring is electrostatically attracted to and held on the susceptor.

However, in the method in which the heat transfer efficiency between the focus ring and the susceptor is improved, the temperature of the focus ring is maintained at a relatively low temperature in etching of each wafer, and hence it is impossible to carry out etching processes or the like that require the focus ring to be at a high temperature, and the kinds of etching processes that can be carried out are limited.

Moreover, in electrostatically attracting and holding the focus ring, direct-current voltage has to be applied to the susceptor during etching, but since radio frequency electrical power is also applied to the susceptor during etching, abnormal electric discharge toward a supply path for the direct-current voltage may occur, and also, the radio frequency electrical power may flow backward to a ground via the supply path for the direct-current voltage.

Further, in the case where the heat transfer sheet is interposed between the focus ring and the susceptor, vacuum heat insulation layers may be respectively formed between the focus ring and the heat transfer sheet and between the transfer sheet and the susceptor, and hence it is difficult to accurately control the temperature of the focus ring.

Of the above described problems, to solve the problem that the kinds of etching processes that can be carried out are limited, methods in which the focus ring is actively heated during etching are being developed. Examples of such methods include a method in which the focus ring is radiated and heated by a lamp or a laser, a method in which a heater is disposed on the surface of the susceptor on which the focus ring is mounted and the focus ring is heated by the heater, and a method in which a heater is provided inside the focus ring as mentioned above.

However, in the case where the focus ring is radiated by a lamp, other component parts as well as the focus ring are heated, and hence it is difficult to accurately control the temperature of the focus ring due to radiant heat from the heated other component parts.

In the case where the focus ring is radiated and heated by a laser, the heating efficiency cannot be stable, and hence it is difficult to accurately control the temperature of the focus ring.

In the case where a heater is disposed on the surface of the susceptor on which the focus ring is mounted, a vacuum heat insulation layer is formed between the focus ring and the heater, and hence it is difficult to accurately control the temperature of the focus ring.

In the case where a heater is provided inside the focus ring, the electrical power has to be supplied to the heater, but since the susceptor and the focus ring have to be connected to each other by wiring, abnormal electric discharge may occur due to the presence of the wiring, and also radio frequency electrical power may flow backward to a ground via the wiring.

SUMMARY OF THE INVENTION

The present invention provides a substrate processing apparatus and a focus ring heating method that can accurately control the temperature of a focus ring without causing abnormal electric discharge and the back-flow of radio frequency electrical power during the application of radio frequency electrical power.

The present invention provides a substrate processing method that can make the results of plasma processing on all the substrates uniform without causing abnormal electric discharge and the back-flow of radio frequency electrical power during the application of radio frequency electrical power.

Accordingly, in a first aspect of the present invention, there is provided a substrate processing apparatus comprising a housing chamber that houses a substrate, a mounting stage disposed in the housing chamber, for mounting the substrate thereon, and an annular focus ring mounted on the mounting stage in such a manner as to surround the peripheral portion of the mounted substrate, wherein pressure in the housing chamber is reduced, radio frequency electrical power is applied to the mounting stage, and the focus ring generates heat by itself.

According to the first aspect of the present invention, the focus ring generates heat by itself. Thus, it is unnecessary to improve the heat transfer efficiency between the focus ring and the mounting stage and use any external power supply unit that supply heat or power to the focus ring. Therefore, during the application of radio frequency electrical power, abnormal electric discharge and the back-flow of the radio frequency electrical power can be prevented. Moreover, even if a vacuum heat insulation layer is formed between the focus ring and the mounting stage, this does not affect the temperature control of the focus ring, and the other component parts of the substrate processing apparatus do not increase in temperature. As a result, the temperature of the focus ring can be accurately controlled.

The present invention can provide a substrate processing apparatus comprising a magnetic field line generating device that generates magnetic field lines, and wherein the magnetic field lines intersect the focus ring.

According to the first aspect of the present invention, since magnetic field lines generated from the magnetic field line generating device intersect the focus ring, the focus ring can be reliably caused to generate heat by itself through induction heating.

The present invention can provide a substrate processing apparatus, wherein the magnetic field line generating device is electrically connected to a power source via an electrical power supply unit, and when the radio frequency electrical power is applied to the mounting stage, the electrical power supply unit withdraws from an area to which the radio frequency electrical power is applied.

According to the first aspect of the present invention, the electrical power supply unit that electrically connects the magnetic field line generating device and the power source to each other withdraws from the area to which the radio frequency electrical power is applied when the radio frequency electrical power is applied to the mounting stage. As a result, the power supply unit never functions as an antenna for radio frequency electrical power, and hence abnormal discharge and the back-flow of radio frequency electrical power can be reliably prevented.

The present invention can provide a substrate processing apparatus, wherein the focus ring has therein an induction heating unit, the induction heating unit comprising at least one selected from the group consisting of iron, stainless steel, aluminum, silicon, silicon carbide, and carbon.

According to the first aspect of the present invention, since the focus ring has therein the induction heating unit comprising at least one selected from a group consisting of iron, stainless steel, aluminum, silicon, silicon carbide, and carbon, due to the intersection of the focus ring and magnetic field lines, an eddy current is produced in the induction heating unit, so that the focus ring can be more reliably caused to generate heat by itself through Joule heat generated due to the eddy current.

The present invention can provide a substrate processing apparatus, wherein the magnetic field line generating device comprises an annular coil and is disposed to face the focus ring.

According to the first aspect of the present invention, since the magnetic field line generating device is an annular coil and is disposed to face the annular focus ring, magnetic field lines generated from the coil can be caused to evenly intersect the focus ring, and hence the focus ring can be evenly heated in the circumferential direction thereof.

The present invention can provide a substrate processing apparatus, wherein the entire surface of the coil is covered by a heat insulation/electrical insulation material and interposed between the focus ring and the mounting stage.

According to the first aspect of the present invention, since the coil is covered by the heat insulation/electrical insulation material, the back-flow of radio frequency electrical power via the coil can be prevented. Moreover, since the coil with the entire surface thereof covered by the heat insulation/electrical insulation material is interposed between the focus ring and the mounting stage, heat of the focus ring can be prevented from being transferred to the mounting stage.

Accordingly, in a second aspect of the present invention, there is provided a method of heating an annular focus ring mounted on a mounting stage in such a manner as to surround a peripheral surface of a substrate in a substrate processing apparatus which comprises a housing chamber that houses the substrate, and the mounting stage disposed in the housing chamber, for mounting the substrate thereon, and in which pressure in the housing chamber is reduced, and radio frequency electrical power is applied to the mounting stage, the method comprising a magnetic field line intersecting step of causing magnetic field lines to intersect the focus ring.

According to the second aspect of the present invention, since magnetic field lines intersect the focus ring, the focus ring generates heat by itself through induction heating. Thus, it is unnecessary to improve the heat transfer efficiency between the focus ring and the mounting stage and use any external power supply unit that supplies heat or power to the focus ring. Therefore, during the application of radio frequency electrical power, abnormal electric discharge and the back-flow of the radio frequency electrical power can be prevented. Moreover, even if a vacuum heat insulation layer is formed between the focus ring and the mounting stage, this does not affect the temperature control of the focus ring, and the other component parts of the substrate processing apparatus do not increase in temperature. As a result, the temperature of the focus ring can be accurately controlled.

The present invention can provide a focus ring heating method, wherein the substrate processing apparatus comprises a magnetic field line generating device that generates magnetic field lines, the method comprising an intersection ending step of bringing the intersection of the magnetic field lines and the focus ring to an end, and a radio frequency electrical power applying step of applying the radio frequency electrical power to the mounting stage after the intersection ending step.

According to the second aspect of the present invention, since radio frequency electrical power is applied to the mounting stage after the intersection of magnetic field lines and the focus ring is brought to an end, an electric wire or the like that supplies electrical power for generating magnetic field lines to the magnetic field line generating device can be disconnected during the applicant of radio frequency electrical power. As a result, abnormal discharge toward the electrical wire or the like can be reliably prevented, and also the back-flow of radio frequency electrical power via the electrical wire or the like can be reliably prevented.

The present invention can provide a focus ring heating method, wherein the magnetic field line generating device is electrically connected to a power source via an electrical power supply unit, and the method comprises a power supply unit withdrawing step of, before the radio frequency electrical power applying step, causing the power supply unit to withdraw from an area to which the radio frequency electrical power is applied.

According to the second aspect of the present invention, since the power supply unit withdraws from the area to which radio frequency electrical power is applied before the application of the radio frequency electrical power, abnormal discharge toward the power supply unit can be reliably prevented, and also the back-flow of radio frequency electrical power via the power supply unit can be reliably prevented.

Accordingly, in a third aspect of the present invention, there is provided a substrate processing method of subjecting a plurality of substrates to plasma processing one by one using plasma generated due to radio frequency electrical power in a substrate processing apparatus that comprises a housing chamber that houses the substrates, a mounting stage disposed in the housing chamber, for mounting the substrate thereon, and an annular focus ring mounted on the mounting stage in such a manner as to surround a peripheral portion of the mounted substrate and in which the radio frequency electrical power is applied to the mounting stage, the method comprising a temperature increasing step of increasing a temperature of the focus ring to a predetermined temperature, a first processing step of subjecting the first substrate to the plasma processing without supplying heat and electrical power to the focus ring from outside when the temperature of the focus ring has been increased to the predetermined temperature, and a second processing step of subjecting the second and subsequent substrates to the plasma processing one by one without supplying heat and electrical power to the focus ring from outside, wherein the predetermined temperature is equal to an initial temperature of the focus ring in the plasma processing on the second and subsequent substrates.

According to the third aspect of the present invention, since the first substrate is subjected to the plasma processing when the temperature of the focus ring has been increased to the initial temperature of the focus ring in the plasma processing on the second and subsequent wafers, the initial temperatures of the focus ring in the plasma processing on all the substrates can be made equal, and hence the results of the plasma processing on all the substrates can be made uniform. Moreover, since the substrates are subjected to the plasma processing one by one without supplying heat or electrical power to the focus ring from outside, a supply path or the like for supplying heat or electrical power to the focus ring can be disconnected during the application of radio frequency electrical power. As a result, during the application of radio frequency electrical power, abnormal electric discharge toward the supply path or the like and the back-flow of the radio frequency electrical power via the supply path or the like can be prevented.

The present invention can provide a substrate processing method, wherein the temperature increasing step comprises a leaving-to-cool step of increasing the temperature of the focus ring to a higher temperature than the predetermined temperature and then leaving the focus ring as it is until the focus ring cools to the predetermined temperature.

According to the third aspect of the present invention, after the temperature of the focus ring is increased to a higher temperature than a predetermined temperature which is the initial temperature of the focus ring in the plasma processing on the second and subsequent wafers, the focus ring is left as it is until it cools to the predetermined temperature. That is, since the temperature of the focus ring is once increased to a higher temperature than the predetermined temperature, the temperature of the entire focus ring can be reliably made equal to the predetermined temperature.

The present invention can provide a substrate processing method, wherein in the temperature increasing step, the magnetic field lines intersect the focus ring.

According to the third aspect of the present invention, since magnetic field lines generated from the magnetic field line generating device intersect the focus ring, the focus ring can be caused to generate heat by itself through induction heating. As a result, it becomes unnecessary to improve the heat transfer efficiency between the focus ring and the mounting stage and use any external power supply unit that supply heat or power to the focus ring.

The features and advantages of the invention will become more apparent from the following detained description taken in conjunction with the accompanying drawings.

BRIEF DESCRIPTION OF THE DRAWINGS

FIGS. 7A and 7B are graphs showing changes in focus ring temperature with time during conventional etching on each wafer, in which FIG. 7A shows a case where a focus ring is merely mounted on a susceptor, and FIG. 7B shows a case where the focus ring is actively cooled to control the temperature thereof so that changes in focus ring temperature with time during the etching on each wafer are made substantially uniform.

DETAILED DESCRIPTION OF THE PREFERRED EMBODIMENTS

The present invention will now be described with reference to the drawings showing a preferred embodiment thereof.

First, a description will be given of a substrate processing apparatus according to the embodiment.

Figure 1:
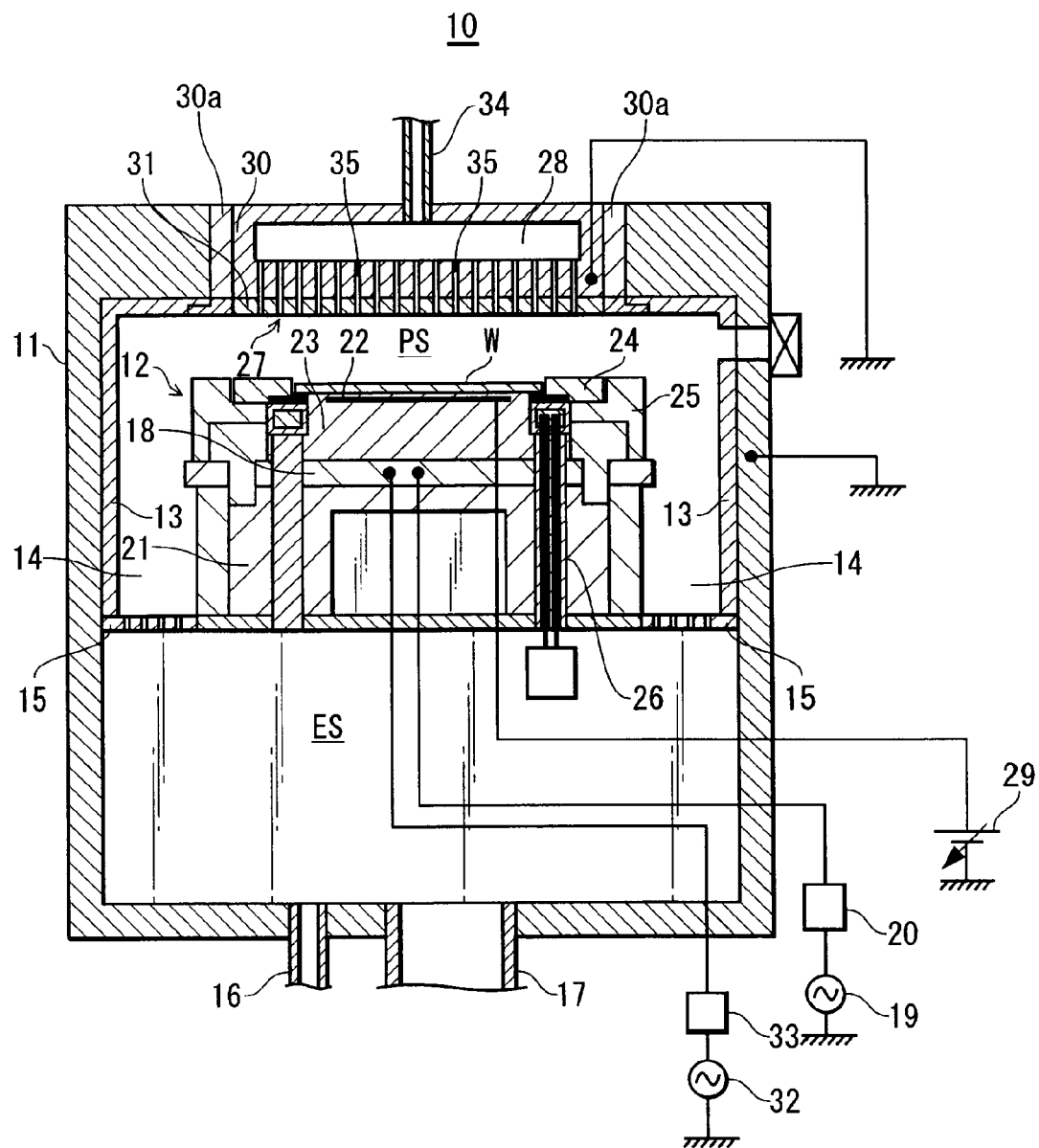
FIG. 1 is a sectional view schematically showing the construction of a substrate processing apparatus according to an embodiment of the present invention.

FIG. 1 is a sectional view schematically showing the construction of the substrate processing apparatus according to the present embodiment. The substrate processing apparatus according to the present embodiment is adapted to subject semiconductor wafers W as substrates to RIE (Reactive Ion Etching) processing.

As shown in FIG. 1, the substrate processing apparatus 10 is comprised of a cylindrical housing chamber 11 that has a processing space PS in an upper part thereof. In the processing space PS, plasma is produced as will be described later. Moreover, the substrate processing housing chamber 11 has disposed therein a cylindrical susceptor 12 as a stage on which is mounted a semiconductor wafer W (hereinafter referred to merely as a "wafer W") having a diameter of, for example, 300 mm. An inner wall side surface of the substrate processing housing chamber 11 is covered by a side wall member 13 made of an electrical insulating material.

In the substrate processing apparatus 10, an exhaust flow path 14 that acts as a flow path through which gas above the susceptor 12 is exhausted out of the housing chamber 11 is formed between the inner wall of the substrate processing housing chamber 11 and the side face of the susceptor 12. An exhaust plate 15 which is a plate-shaped member having a large number of vent holes therein is disposed in the exhaust flow path 14. The exhaust plate 15 partitions the exhaust flow path 14 from an exhaust space ES which is a space in a lower portion of the housing chamber 11. Moreover, a roughing exhaust pipe 16 and a main exhaust pipe 17 are provided opening out from the exhaust space ES. The roughing exhaust pipe 16 has a DP (dry pump) (not shown) connected thereto, and the main exhaust pipe 17 has a TMP (turbo-molecular pump) (not shown) connected thereto.

The roughing exhaust pipe 16, the main exhaust pipe 17, the DP, and the TMP together constitute an exhausting apparatus, which exhausts gas in the processing space PS out of the housing chamber 11 via the exhaust flow path 14 and the exhaust space ES and reduces the pressure in the processing space PS to a high vacuum state.

The susceptor 12 has therein a radio frequency power plate 18 made of a conductive material, for example aluminum. A first radio frequency power source 19 is connected to the radio frequency power plate 18 via a first matcher 20. The first radio frequency power source 19 applies first radio frequency electrical power to the radio frequency power plate 18. The first matcher 20 reduces reflection of the radio frequency electrical power from the radio frequency power plate 18 so as to maximize the efficiency of the supply of the radio frequency electrical power into the radio frequency power plate 18. Moreover, a second radio frequency power source 32 is connected to the radio frequency power plate 18 via a second matcher 33. The second radio frequency power source 32 supplies second radio frequency electrical power of a different frequency from the first radio frequency electrical power to the radio frequency power plate 18. The second matcher 33 has a similar function to the first matcher 20. Thus, the susceptor 12 acts as a lower radio frequency electrode and applies first radio frequency electrical power and second radio frequency electrical power into the processing space PS. In the susceptor 12, a base 21 made of an electrical insulating material, for example alumina ($Al_2O_3$) is disposed below the radio frequency power plate 18.

In the susceptor 12, an electrostatic chuck 23 is provided above the radio frequency power plate 18. The electrostatic chuck 23 has an electrode plate 22 to which a direct-current power source 29 is electrically connected. When a wafer W is mounted on the susceptor 12, the wafer W is disposed on the electrostatic chuck 23. The wafer W disposed on the electrostatic chuck 23 is attracted to and held on an upper surface of the electrostatic chuck 23 through a Coulomb force or a Johnsen-Rahbek force due to the direct-current power source applied to the electrode plate 22.

An annular focus ring 24 is provided on an upper surface of the susceptor 12 so as to surround the wafer W attracted to and held on the upper surface of the susceptor 12. The focus ring 24 is made of silicon (Si), silica ($SiO_2$), or silicon carbide (SiC). The focus ring 24 is exposed to the processing space PS, and focuses plasma in the processing space PS toward a front surface of the wafer W, thus improving the efficiency of the RIE processing. Moreover, an annular cover ring 25 made of quartz that protects a side face of the focus ring 24 is disposed surrounding the focus ring 24.

Moreover, a focus ring temperature controller 26 that controls the temperature of the focus ring 24 is disposed in the susceptor 12. The construction and operation of the focus ring temperature controller 26 will be described later.

A coolant chamber, not shown, to which a coolant at a predetermined temperature is supplied, is provided inside the susceptor 12 so that a processing temperature of the wafer W attracted to and held on the upper surface of the susceptor 12 is controlled through the temperature of the supplied coolant. A plurality of heat transfer gas supply holes (not shown) are provided in a portion of the upper surface of the susceptor 12 on which the wafer W is attracted and held. The heat transfer gas supply holes supply helium (He) gas as a heat transfer gas into a gap between the susceptor 12 and the rear surface of the wafer W so as to improve the heat transfer efficiency between the wafer W and the susceptor 12.

A gas introducing shower head 27 is disposed in a ceiling portion of the housing chamber 11 in such a manner as to face the susceptor 12. The gas introducing shower head 27 has an electrode plate support 30 having a buffer chamber 28 formed therein, and an upper electrode plate 31 supported from the electrode plate support 30. The upper electrode plate 31 is a disk-shaped member made of a conductive material, for example silicon, and the electrode plate support 30 is also made of a conductive material. An electrical insulating ring 30a made of an electrical insulating material is interposed between the ceiling portion of the housing chamber 11 and the electrode plate support 30. The electrical insulating ring 30a electrically insulates the electrode plate support 30 from the ceiling portion of the housing chamber 11. It should be noted that the electrode plate support 30 is at the ground potential.

A processing gas introducing pipe 34 leading from a processing gas supply unit (not shown) is connected to the buffer chamber 28 in the gas introducing shower head 27. Moreover, the gas introducing shower head 27 has therein a plurality of gas holes 35 that communicate the buffer chamber 28 to the processing space PS. A processing gas supplied from the processing gas introducing pipe 34 into the buffer chamber 28 is supplied by the gas introducing shower head 27 into the processing space PS via the gas holes 35.

In the housing chamber 11 of the plasma processing apparatus 10, the susceptor 12 applies first and second radio frequency electrical power into the processing space PS, i.e. the space between the susceptor 12 and the upper electrode plate 31, as described above, whereby the processing gas supplied into the processing space PS from the gas introducing shower head 27 is turned into high-density plasma, so that positive ions and radicals are produced. The wafer W is subjected to the RIE processing by the produced positive ions and radicals.

Figure 2:
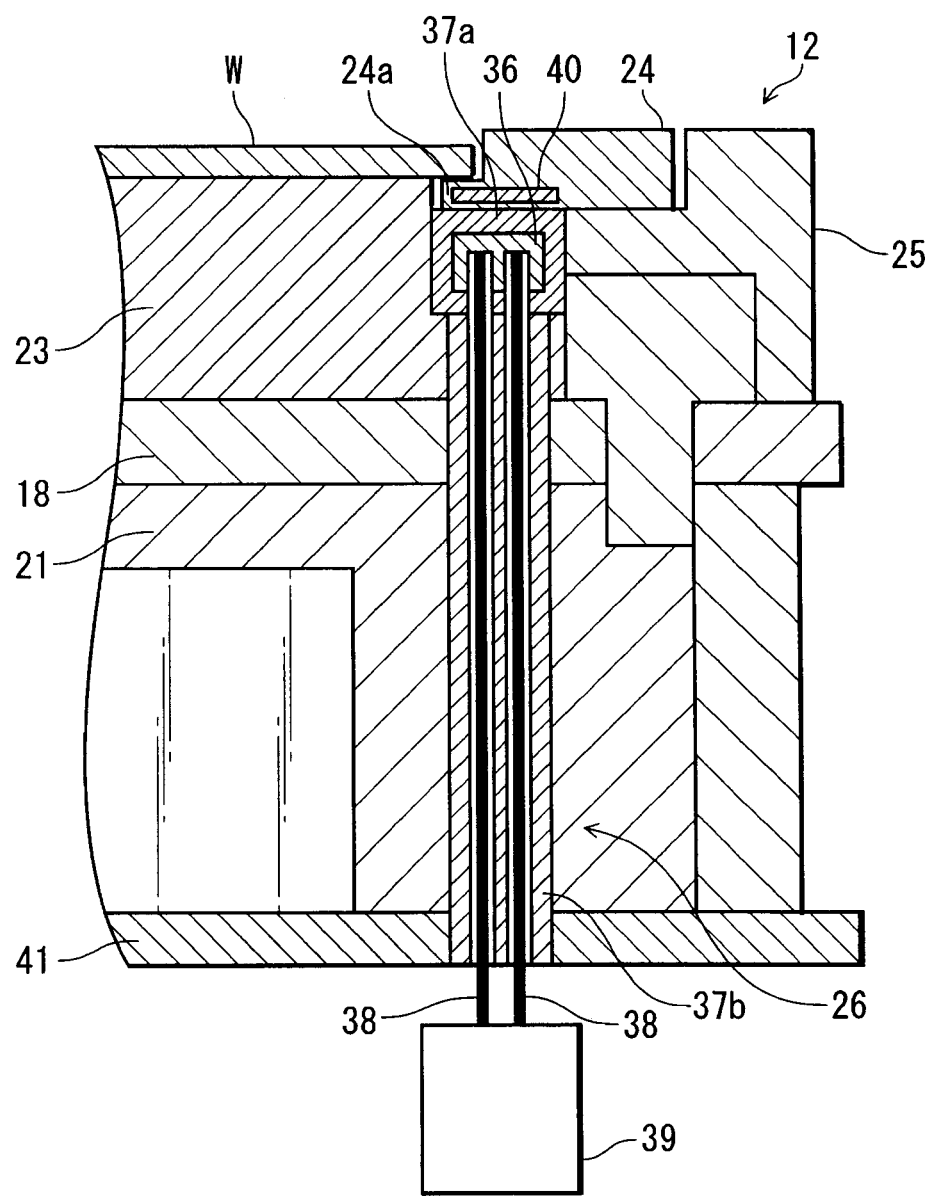
FIG. 2 is a sectional view schematically showing the construction of a focus ring temperature controller appearing in FIG. 1.

FIG. 2 is a sectional view showing the construction of the focus ring temperature controller appearing in FIG. 1.

In general, as shown in FIG. 2, a peripheral portion of the wafer W mounted on the susceptor 12 protrudes over an inner peripheral portion 24a of the focus ring 24. Therefore, the peripheral portion of the wafer W is affected by radiant heat from the focus ring 24. Accordingly, the focus ring temperature controller 26 controls the temperature of the focus ring 24 so as to minimize the effects of the radiant heat from the focus ring 24 on the peripheral portion of the wafer W.

The focus ring temperature controller 26 is comprised of an annular induction coil 36 (magnetic field line generator), a heat insulation/electrical insulation unit 37a that covers the entire surface of the induction coil 36, a power supply rod 38 (power supply unit), a heat insulation/electrical insulation unit 37b that covers the power supply rod 38, and a lifting and lowering device 39 that lifts and lowers the power supply rod 38 vertically as viewed in FIG. 2.

On the other hand, the focus ring 24 has an induction heating unit 40 that is an annular plate-shaped member is disposed inside the inner peripheral portion 24a of the focus ring 24. The induction heating unit 40 is comprised of a conductor or semiconductor, for example, at least one of iron, stainless steel, aluminum, silicon, silicon carbide, and carbon.

The induction coil 36 has substantially the same diameter as the diameter of the inner peripheral portion 24a of the focus ring 24, and is disposed such that the central axis of the focus ring 24 corresponds to the central axis of the induction coil 36. Thus, the induction coil 36 faces the inner peripheral portion 24a of the focus ring 24. Moreover, the induction coil 36 is disposed on the electrostatic chuck 23 and thus interposed between the electrostatic chuck 23 and the focus ring 24.

When supplied with electrical power from the power supply rod 38, the induction coil 36 produces magnetic field lines. Since the induction coil 36 faces the inner peripheral portion 24a, the produced magnetic field lines intersect the induction heating unit 40. When the magnetic field lines intersect the induction heating unit 40, an eddy current is produced in the induction heating unit 40 through magnetic-field induction, and the induction heating unit 40 generates heat through Joule heat due to the eddy current and the electric resistance of the induction heating unit 40. This causes the focus ring 24 to generate heat by itself.

The heat insulation/electrical insulation unit 37a thermally insulates the focus ring 24 and the electrostatic chuck 23 and also electrically insulates the induction coil 36 and the radio frequency power plate 18. It is preferred that the heat insulation/electrical insulation unit 37a is made of a low-dielectric constant material, which has, for example, a dielectric constant not greater than 12 and a heat transfer coefficient of 30 W/m·K.

The power supply rod 38 electrically connects a power source (not shown) and the induction coil 36 to each other and supplies electrical power to the induction coil 36. The power supply rod 38 projects out from a substrate 41 disposed below the base 21 of the susceptor 12 and penetrates the base 21, the radio frequency power plate 18, electrostatic chuck 23, and the heat-insulation/electrical insulation unit 37a and extends to the induction coil 36.

When the substrate processing apparatus 10 subjects the wafer W to the RIE processing, first and second radio frequency electrical power is applied to the radio frequency power plate 18. At this time, the first and second radio frequency electrical power applied to the radio frequency power plate 18 is also applied to the electrostatic chuck 23. Thus, if the power supply rod 38 projects out as high as the radio frequency power plate 18 and the electrostatic chuck 23 as shown in FIG. 2, the power supply rod 38 functions as an antenna for the first and second radio frequency electrical power, and thus, the first and second radio frequency electrical power applied to the radio frequency power plate 18 and the like is likely to flow backward into the power source and the like. On the other hand, since the base 21 is made of alumina, it shuts off the first and second radio frequency electrical power, so that the first and second radio frequency power is prevented from being applied to the substrate 41.

Figure 3:
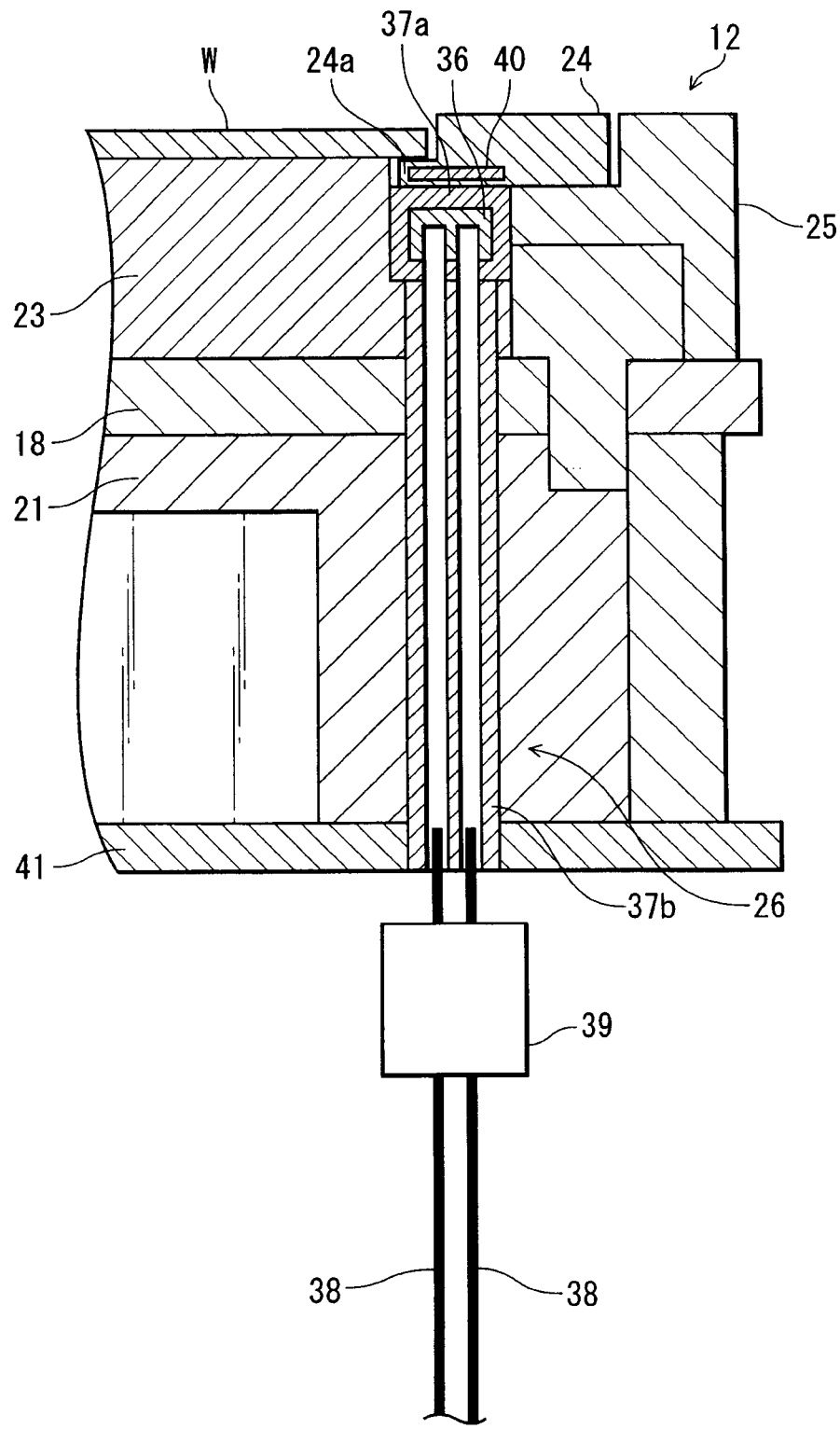
FIG. 3 is a view showing a state in which an electrical power supply rod has moved down in the focus ring temperature controller in FIG. 2.

In the substrate processing apparatus 10, when the first and second radio frequency power is applied to the radio frequency power plate 18, the lifting and lowering device 39 lowers the power supply rod 38 as shown in FIG. 3, so that the power supply rod 38 is withdrawn from an area in the vicinity of the radio frequency power plate 18 and the electrostatic chuck 23, the area to which the first and second radio frequency power is applied, so that a distal end of the power supply rod 38 lowers down to the substrate 41. This prevents the power supply rod 38 from functioning as an antenna for radio frequency electrical power.

According to the substrate processing apparatus 10 described above, since magnetic field lines generated from the induction coil 36 intersect the induction heating unit 40 inside the inner peripheral portion 24a of the focus ring 24, the focus ring 24 generates heat by itself. Thus, it is unnecessary to improve the heat transfer efficiency between the focus ring 24 and the susceptor 12 and use any external power supply unit that supply heat or power to the focus ring 24. Therefore, during the application of first and second radio frequency electrical power, abnormal electric discharge via a heat or power supply unit and the back-flow of the radio frequency electrical power can be prevented. Moreover, since it is unnecessary to improve the degree of adhesion of the focus ring 24 and the susceptor 12, the surface conditions of the focus ring 24 and the susceptor 12 can be arbitrarily set. Further, since the pressure in the processing space PS is reduced, a vacuum heat insulation layer is likely to be formed between the focus ring 24 and the susceptor 12, but since the focus ring 24 generates heat by itself, the formation of the vacuum heat insulation layer does not affect the temperature control of the focus ring 24, and the other component parts of the substrate processing apparatus 10 do not increase in temperature, and hence the focus ring 24 is hardly affected by radiant heat from the other component parts. Thus, the temperature of the focus ring 24 can be accurately controlled.

In the substrate processing apparatus 10 described above, when first and second radio frequency electrical power is applied to the radio frequency power plate 18, the power supply rod 38 withdraws from the area in the vicinity of the radio frequency power plate 18 and the electrostatic chuck 23. Thus, the power supply rod 38 never functions as an antenna for first and second radio frequency electrical power, abnormal discharge and the back-flow of radio frequency electrical power can be reliably prevented.

Further, in the substrate processing apparatus 10 described above, since the annular induction coil 36 faces the inner peripheral portion 24a of the focus ring 24, magnetic field lines generated from the induction coil 36 can be made to intersect the induction heating unit 40 evenly in the circumferential direction thereof, and hence the focus ring 24 can be evenly heated in the circumferential direction thereof.

Further, in the substrate processing apparatus 10 described above, since the entire surface of the induction coil 36 is covered by the heat insulation/electrical insulation unit 37a, the back-flow of radio frequency electrical power via the induction coil 36 can be prevented, and also, since the induction coil 36 is interposed between the electrostatic chuck 23 and the focus ring 24, the heat insulation/electrical insulation unit 37a can prevent heat of the focus ring 24 from being transferred to the susceptor 12.

Although in the substrate processing apparatus 10 described above, the inner peripheral portion 24a of the focus ring 24 is heated, any part of the focus ring 24 may be heated since the material constituting the focus ring 24 has a high heat transfer coefficient. For example, the induction coil 36 of the focus ring temperature controller 26 may be disposed to face the outer peripheral portion of the focus ring 24 so that the outer peripheral portion of the focus ring 24 can be heated. In this case as well, the temperature of the inner peripheral portion 24a can be easily controlled.

Further, when magnetic field lines intersect the induction heating unit 40 inside the inner peripheral portion 24a, this causes self-heating of the focus ring 24, and hence insofar as the magnetic field lines intersect the induction heating unit 40, the induction coil 36 may be disposed on the electrostatic chuck 23 or incorporated in the electrostatic chuck 23.

Next, a description will be given of a focus ring heating method and a substrate processing method according to the present embodiment.

Figure 4:
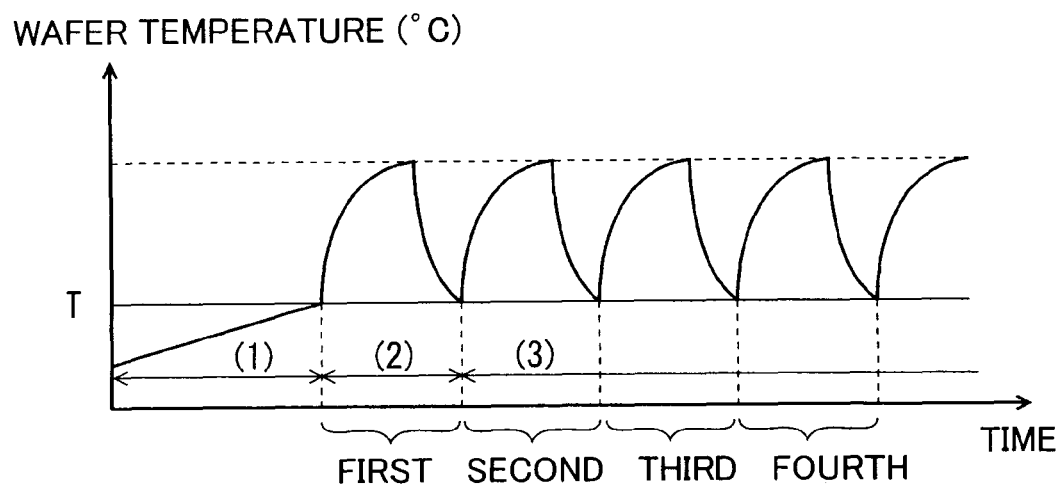
FIG. 4 is a graph showing changes with time in focus ring temperature in a focus ring heating method and a substrate processing method according to the embodiment.

FIG. 4 is a graph showing changes in focus ring temperature with time in the focus ring heating method and the substrate processing method according to the present embodiment.

In the focus ring heating method and the substrate processing method according to the present embodiment, first, the induction coil 36 of the focus ring temperature controller 26 is caused to generate magnetic field lines, which are in turn caused to intersect the induction heating unit 40 of the focus ring 24 (magnetic field line intersecting step) so as to cause self-heating of the focus ring 24, so that the temperature of the focus ring 24 is increased to T ° C. from the temperature of the susceptor 12 maintained at approximately 60° C. through the temperature of the coolant in the coolant chamber (temperature increasing step) (FIG. 4(1)). Here, the temperature T ° C. is equal to the initial temperature of the focus ring 24 in the RIE processing of the second and subsequent wafers W.

After that, the supply of electrical power to the induction coil 36 is stopped to bring the intersection of the magnetic field lines and the induction heating unit 40 to an end (intersection ending step), so that the temperature increase of the focus ring 24 is stopped. At this time, the power supply rod 38 is lowered by the lifting and lowering device 39 to withdraw from an area in the vicinity of the radio frequency power plate 18 and the electrostatic chuck 23 (power supply unit withdrawing step). Thereafter, no electrical power is supplied to the induction coil 36, and no heat and electrical power is supplied to the focus ring 24 from outside.

Next, first and second radio frequency electrical power is supplied to the radio frequency power plate 18 (radio frequency electrical power applying step), so that positive ions and radicals are produced in the processing space PS. Then, the first wafer W is subjected to the RIE processing (first processing step) (FIG. 4(2)), and then the second and subsequent wafers W are subjected to the RIE processing one by one (second processing step) (FIG. 4(3)).

According to the substrate processing method of the present embodiment, since the first wafer W is subjected to the RIE processing when the focus ring 24 has been increased to the initial temperature (T ° C.) of the focus ring 24 in the RIE processing on the second and subsequent wafers W, the initial temperatures of the focus ring 24 in the RIE processing on all the wafers W can be made equal, and hence the results of the RIE processing on all the wafers W can be made uniform. Moreover, since the wafers W are subjected to the RIE processing one by one without supplying heat or electrical power to the focus ring 24 itself from outside, even if the substrate processing apparatus 10 has a supply path or the like for supplying heat or electrical power to the focus ring 24 from outside, the supply path or the like can be disconnected during the application of first and second radio frequency electrical power. Therefore, during the application of first and second radio frequency electrical power, abnormal electric discharge toward the supply path or the like and the back-flow of the radio frequency electrical power via the supply path or the like can be prevented.

Moreover, according to the substrate processing method described above, since the temperature of the focus ring 24 does not have to be actively controlled during the RIE processing on each wafer W, disturbance factors against the RIE processing can be reduced, and hence the RIE processing on each wafer W can be performed in a stable manner.

Although in the substrate processing method described above, the first wafer W is subjected to the RIE processing only when the temperature of the focus ring 24 has been increased from the temperature of the susceptor 12 to T ° C., there may be a case where due to heat transferability inside the focus ring 24, it is difficult to increase the temperature of the entire focus ring 24 to T ° C. merely through temperature increase.

Figure 5:
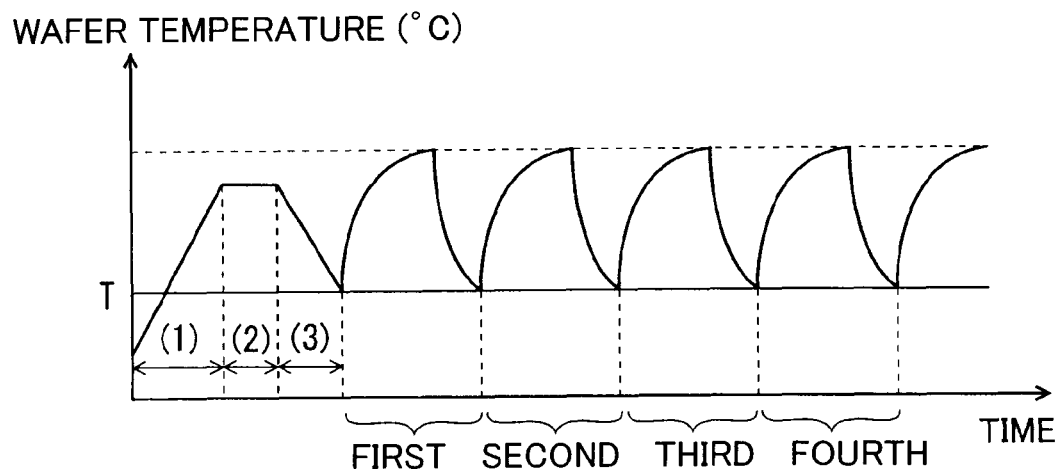
FIG. 5 is a graph showing changes in focus ring temperature with time in a variation of the focus ring heating method and the substrate processing method according to the embodiment.

To cope with such a case, first, the temperature of the focus ring 24 is increased to a higher temperature than T ° C. (FIG. 5(1)), then the temperature of the focus ring 24 is maintained at the high temperature for a predetermined period of time (FIG. 5(2)), then the supply of electrical power to the induction coil 36 is stopped to bring the intersection of magnetic field lines and the induction heating unit 40 to an end, and the focus ring 24 is left as it is until it cools (FIG. 5(3)). After that, when the temperature of the focus ring 24 cooled by leaving as it is has reached T ° C., first and second radio frequency electrical power is applied to the radio frequency power plate 18 to perform the RIE processing on the first wafer W. Since the focus ring 24 is once increased to a higher temperature than T ° C. as described above, the entire focus ring 24 can be reliably increased to T ° C. before the RIE processing on the first wafer W is started.

Further, according to the focus ring heating method of the present embodiment, since first and second radio frequency electrical power is applied to the radio frequency power plate 18 after the intersection of magnetic field lines and the induction heating unit 40 is brought to an end, the power supply rod 38 does not have to be connected to the induction coil 36 during the application of the first and second radio frequency electrical power, and hence the power supply rod 38 can be caused to withdraw from the area in the vicinity of the radio frequency power plate 18 and the electrostatic chuck 23 before the application of the first and second radio frequency electrical power. Therefore, the occurrence of abnormal electric discharge toward the power supply rod 38 can be reliably prevented, and also, the back-flow of radio frequency electrical power via the power supply rod 38 can be reliably prevented.

Figure 6:
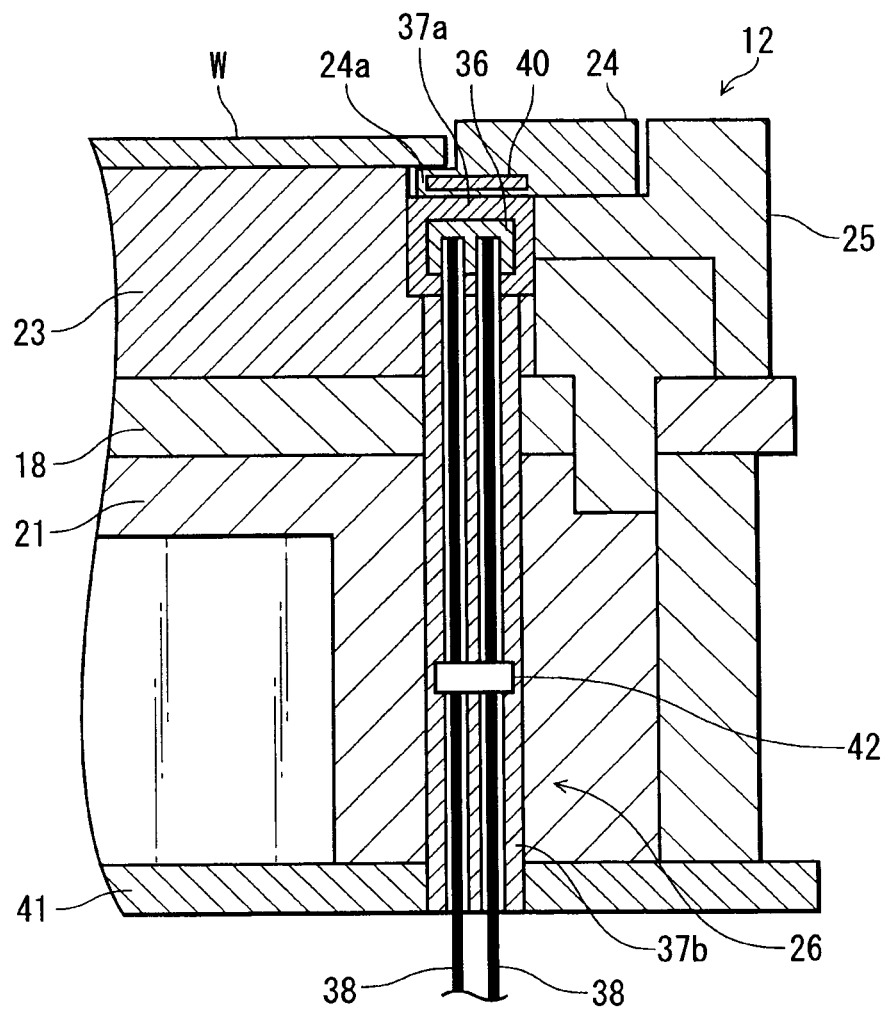
FIG. 6 is a view showing a variation of the focus ring temperature controller in FIG. 2.
Figure 7A:
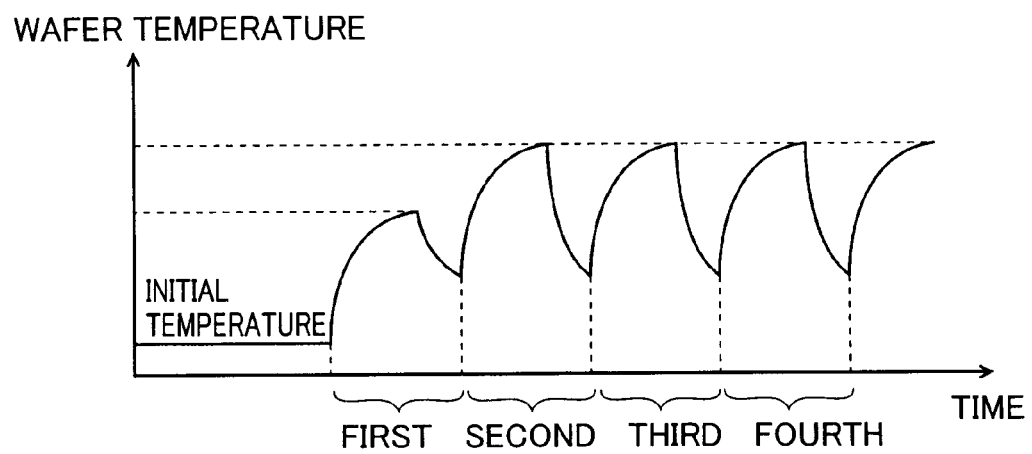
Figure 7B:
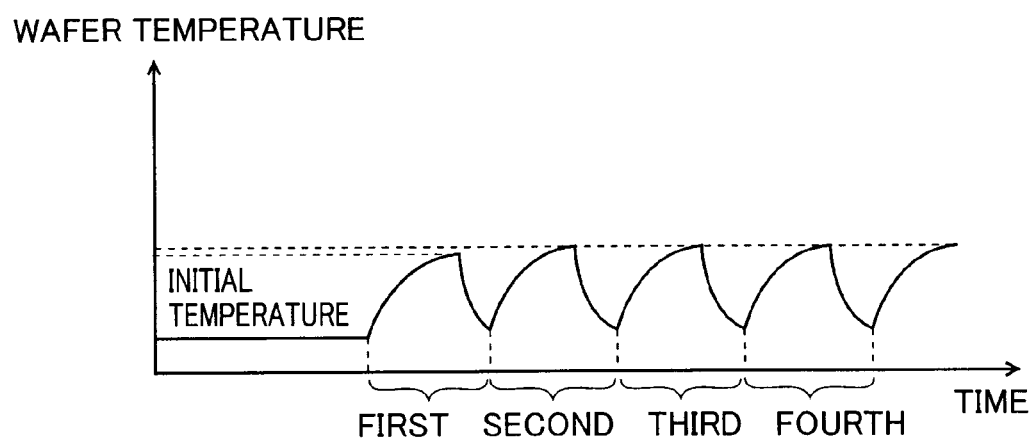

Although in the substrate processing apparatus 10 described above, the power supply rod 38 is lifted and lowered by the lifting and lowering device 39, the power supply rod 38 may be kept connected to the induction coil 36 without being lifted or lowered. In this case, as shown in FIG. 6, a control section such as a vacuum filter 42, which controls connection and disconnection of the power supply rod 38 may be provided part way along the power supply rod 38. It should be noted that the vacuum filter 42 is provided in the vicinity of the base 21. When first and second radio frequency electrical power is supplied to the radio frequency power plate 18, the vacuum filter 42 shuts off the power supply rod 38. At this time, the distal end of a lower part of the disconnected power supply rod 38 is not positioned in the vicinity of the radio frequency power plate 18 and the electrostatic chuck 23, and hence the lower part of the power supply rod 38 does not function as an antenna. Therefore, abnormal electric discharge and the back-flow of radio frequency electrical power can be reliably prevented.

Further, although in the substrate processing apparatus 10 described above, the focus ring 24 has the induction heating unit 40, the focus ring 24 should not necessarily have the induction heating unit 40 since the focus ring 24 is a semiconductor made of silicon or the like and generates heat by itself through magnetic-field induction upon intersecting magnetic field lines generated from the induction coil 36.

It is to be understood that the object of the present invention may also be accomplished by supplying a computer or an external server with a storage medium in which a program code of software, which realizes the functions of the above described embodiment is stored, and causing a CPU or the like of the computer to read out and execute the program code stored in the storage medium.

In this case, the program code itself read from the storage medium realizes the functions of the above described embodiment, and hence the program code and a storage medium on which the program code is stored constitute the present invention.

Examples of the storage medium for supplying the program code include a floppy (registered trademark) disk, a hard disk, a magnetic-optical disk, an optical disk such as a CD-ROM, a CD-R, a CD-RW, a DVD-ROM, a DVD-RAM, a DVD-RW, and a DVD+RW, a magnetic tape, a nonvolatile memory card, and a ROM. Alternatively, the program code may be downloaded from another computer, not shown, a database, or the like connected to the Internet, a commercial network, a local area network, or the like.

Further, it is to be understood that the functions of the above described embodiment may be accomplished not only by executing a program code read out by a computer, but also by causing an OS (operating system) or the like which operates on the computer to perform a part or all of the actual operations based on instructions of the program code.

Further, it is to be understood that the functions of the above described embodiment may be accomplished by writing a program code read out from the storage medium into a memory provided in an expansion board inserted into a computer or a memory provided in an expansion unit connected to the computer and then causing a CPU or the like provided in the expansion board or the expansion unit to perform a part or all of the actual operations based on instructions of the program code.

The form of the program code may be an object code, a program code executed by an interpreter, or script data supplied to an OS.

What is claimed is:

1. A substrate processing apparatus comprising: a housing chamber that houses a substrate;
   a mounting stage disposed in said housing chamber, for mounting the substrate thereon;
   an annular focus ring mounted on said mounting stage in such a manner as to surround a peripheral portion of the mounted substrate, said annular focus ring and said substrate separating from each other; and
   a magnetic field line generating device disposed on said mounting stage, said magnetic field line generating device being interposed between said mounting stage and said annular focus ring,
   wherein said magnetic field line generating device comprises an annular coil, an entire surface of said annular coil being covered by a heat insulation/electrical insulation material,
   wherein said annular focus ring has an annular plate-shaped induction heating unit which is disposed inside said annular focus ring, an entire surface of said induction heating unit being covered by said annular focus ring,
   wherein said magnetic field line generating device faces said induction heating unit,
   wherein said focus ring, said induction heating unit and said annular coil are disposed such that respective central axes of said annular focus ring, said induction heating unit and said annular coil are coincident with each other,
   wherein pressure in said housing chamber is reduced, radio frequency electrical power is applied to said mounting stage, and said annular focus ring generates heat by itself, and
   wherein said magnetic field line generating device generates magnetic field lines, and the magnetic field lines intersect said annular focus ring.

2. A substrate processing apparatus as claimed in claim 1, wherein said magnetic field line generating device is electrically connected to a power source via an electrical power supply unit which is included in said mounting stage, and when the radio frequency electrical power is applied to said mounting stage, the electrical power supply unit becomes apart from said magnetic field line generating device and lowers down inside said mounting stage so as to withdraw from an area to which the radio frequency electrical power is applied.

3. A substrate processing apparatus as claimed in claim 1, wherein the induction heating unit comprises at least one selected from a group consisting of iron, stainless steel, aluminum, silicon, silicon carbide, and carbon.

4. A substrate processing apparatus as claimed in claim 1, wherein said annular focus ring has an inner peripheral portion, and the induction heating unit is disposed inside the inner peripheral portion.

5. A substrate processing apparatus as claimed in claim 2, wherein said mounting stage has a radio frequency power plate to which radio frequency power is applied, an electrostatic chuck which is provided above the radio frequency power plate, and a base which is disposed below the radio frequency power plate,
   wherein the base is made of an electrical insulating material so as to shut off the radio frequency power,
   wherein another substrate is disposed below the base, and
   wherein when the radio frequency electrical power is applied to said mounting stage, the electrical power supply unit lowers down to the another substrate.

* * * * *